United States Patent
Chen et al.

(10) Patent No.: US 11,153,987 B2
(45) Date of Patent: Oct. 19, 2021

(54) CONNECTING ASSEMBLY AND CABLE MANAGEMENT DEVICE THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Kai-Wen Yu, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 47 days.

(21) Appl. No.: 16/711,402

(22) Filed: Dec. 11, 2019

(65) Prior Publication Data
US 2021/0068298 A1    Mar. 4, 2021

(30) Foreign Application Priority Data

Sep. 4, 2019    (TW) .................................. 108132167

(51) Int. Cl.
*H05K 7/14*    (2006.01)
*H05K 7/18*    (2006.01)

(52) U.S. Cl.
CPC .......... *H05K 7/1491* (2013.01); *H05K 7/183* (2013.01)

(58) Field of Classification Search
CPC .... H05K 7/1491; H05K 7/1489; H05K 7/183; G02B 6/4453
See application file for complete search history.

(56) References Cited

U.S. PATENT DOCUMENTS

| | | | |
|---|---|---|---|
| 6,303,864 B1 * | 10/2001 | Johnson | H05K 7/1491 174/68.3 |
| 6,945,504 B2 | 9/2005 | Chen | |
| 8,167,146 B2 * | 5/2012 | Yu | H05K 7/1491 211/26 |
| 8,231,014 B2 | 7/2012 | Chen | |
| 8,379,410 B2 * | 2/2013 | Kitten | F16L 3/015 361/826 |
| 9,144,174 B2 * | 9/2015 | Chen | H05K 7/1421 |
| 9,370,121 B2 * | 6/2016 | Chen | F16L 3/015 |
| 9,402,329 B1 | 7/2016 | Chen | |
| 9,474,182 B1 | 10/2016 | Chen | |
| 9,532,483 B1 * | 12/2016 | Chang | H05K 7/1489 |
| 9,867,311 B2 | 1/2018 | Chen | |
| 9,913,398 B1 | 3/2018 | Chen | |

(Continued)

FOREIGN PATENT DOCUMENTS

| CN | 204392731 U | 6/2015 |
|---|---|---|
| JP | 3121054 U | 4/2006 |

(Continued)

*Primary Examiner* — Ko H Chan
(74) *Attorney, Agent, or Firm* — Winston Hsu

(57) ABSTRACT

A cable management device of a connecting assembly includes a connecting member, a component and a cable management arm. The component is connected to the connecting member. The cable management arm is connected to the component in a stretchable and retractable manner. At least one cable management feature is arranged on the cable management arm.

23 Claims, 8 Drawing Sheets

(56) References Cited

U.S. PATENT DOCUMENTS

| | | | |
|---|---|---|---|
| 10,021,977 B2* | 7/2018 | Chen | A47B 88/43 |
| 10,292,301 B1 | 5/2019 | Chen | |
| 10,389,100 B2 | 8/2019 | Chen | |
| 10,886,713 B2 | 1/2021 | Chen | |
| 2004/0079711 A1* | 4/2004 | Hartman | H02G 3/0456 |
| | | | 211/26 |
| 2005/0145582 A1* | 7/2005 | Dubon | H02G 11/00 |
| | | | 211/26 |
| 2011/0100933 A1* | 5/2011 | Kitten | H05K 7/1491 |
| | | | 211/1 |
| 2017/0245389 A1 | 8/2017 | Chen | |

FOREIGN PATENT DOCUMENTS

| | | |
|---|---|---|
| JP | 3200948 U | 11/2015 |
| JP | 2018-26999 A | 2/2018 |
| JP | 2019-37117 A | 3/2019 |
| JP | 2019-140377 A | 8/2019 |

\* cited by examiner

CONNECTING ASSEMBLY AND CABLE MANAGEMENT DEVICE THEREOF

BACKGROUND OF THE INVENTION

1. Field of the Invention

The present invention relates to a cable management frame, and more particularly, to a cable management device capable of being stretched and retracted, and to a connecting assembly including the cable management device.

2. Description of the Prior Art

U.S. Pat. No. 10,389,100 B2 discloses a cable management device. The cable management device includes a first cable management arm, a second cable management arm and a connecting base. The first cable management arm and the second cable management arm are pivoted to the connecting base. Wherein, a fitting member is connected to one of the first cable management arm and the second cable management arm in a stretchable and retractable manner.

However, for different market requirements, sometimes users are not able to use the above arrangement method to make the cable management device be stretched and retracted. Therefore, how to develop a cable management product, which has different structure, has become an issue.

SUMMARY OF THE INVENTION

The present invention provides a cable management device and a length of the cable management device is adjustable.

According to an aspect of the present invention, a cable management device includes a connecting member, a first component and a first cable management arm. The first component is connected to the connecting member. The first cable management arm is connected to the first component in a stretchable and retractable manner. At least one cable management feature is arranged on the first cable management arm.

Preferably, the first component is pivoted to the connecting member.

Preferably, the cable management device further includes a second component pivoted to the connecting member and a second cable management arm connected to the second component in a stretchable and retractable manner.

Preferably, the first component is pivoted to a portion of the connecting member through a first shaft, the second component is pivoted to another portion of the connecting member different from the portion of the connecting member through a second shaft.

Preferably, the cable management device further includes a first elastic member arranged between the first component and the first cable management arm.

Preferably, the cable management device further includes a second elastic member arranged between the second component and the second cable management arm.

Preferably, the cable management device further includes at least one supporting member configured to support one of the first cable management arm and the second cable management arm.

According to another embodiment of the present invention, a connecting assembly includes a first slide rail assembly and a cable management device. The first slide rail assembly includes a first rail and a second rail. Wherein, the first rail and the second rail are movable relative to each other. The cable management device includes a connecting member, a first component and a first cable management arm and a second cable management arm. The first component is connected to the connecting member. The first cable management arm is movable relative to the first component. Wherein, the first cable management arm is able to be mounted to the second rail of the first slide rail assembly through a first mounting device. The second cable management arm is connected to the connecting member. Wherein, the second cable management arm is able to be mounted to the first rail of the first slide rail assembly through a second mounting device.

Preferably, the first component is pivoted to the connecting member, the first cable management arm is connected to the first component in a stretchable and retractable manner.

Preferably, the second cable management arm is connected to the connecting member through a second component.

Preferably, the second component is pivoted to the connecting member, the second cable management arm is connected to the second component in a stretchable and retractable manner, at least one cable management feature is arranged on one of the first cable management arm and the second cable management arm.

Preferably, the first component is pivoted to a portion of the connecting member through a first shaft, the second component is pivoted to another portion of the connecting member different from the portion of the connecting member through a second shaft.

Preferably, the connecting assembly further includes a first elastic member arranged between the first component and the first cable management arm, the first elastic member configured to provide an elastic force to the first cable management arm.

Preferably, the connecting assembly further includes a second elastic member arranged between the second component and the second cable management arm, the second elastic member configured to provide an elastic force to the second cable management arm.

Preferably, the connecting assembly further includes a second slide rail assembly and at least one supporting member. Wherein, the second slide rail assembly comprises a first rail and a second rail. The first rail and the second rail of the second slide rail assembly are movable relative to each other. The at least one supporting member is able to be mounted on the first rail of the second slide rail assembly through a third mounting device. The at least one supporting member is configured to support one of the first cable management arm and the second cable management arm.

According to yet another embodiment of the present invention, a cable management device includes a connecting member, a first component and a first cable management arm. The first component is connected to the connecting member. The first cable management arm is movable relative to the first component. Wherein, at least one cable management feature is arranged on the first cable management arm.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
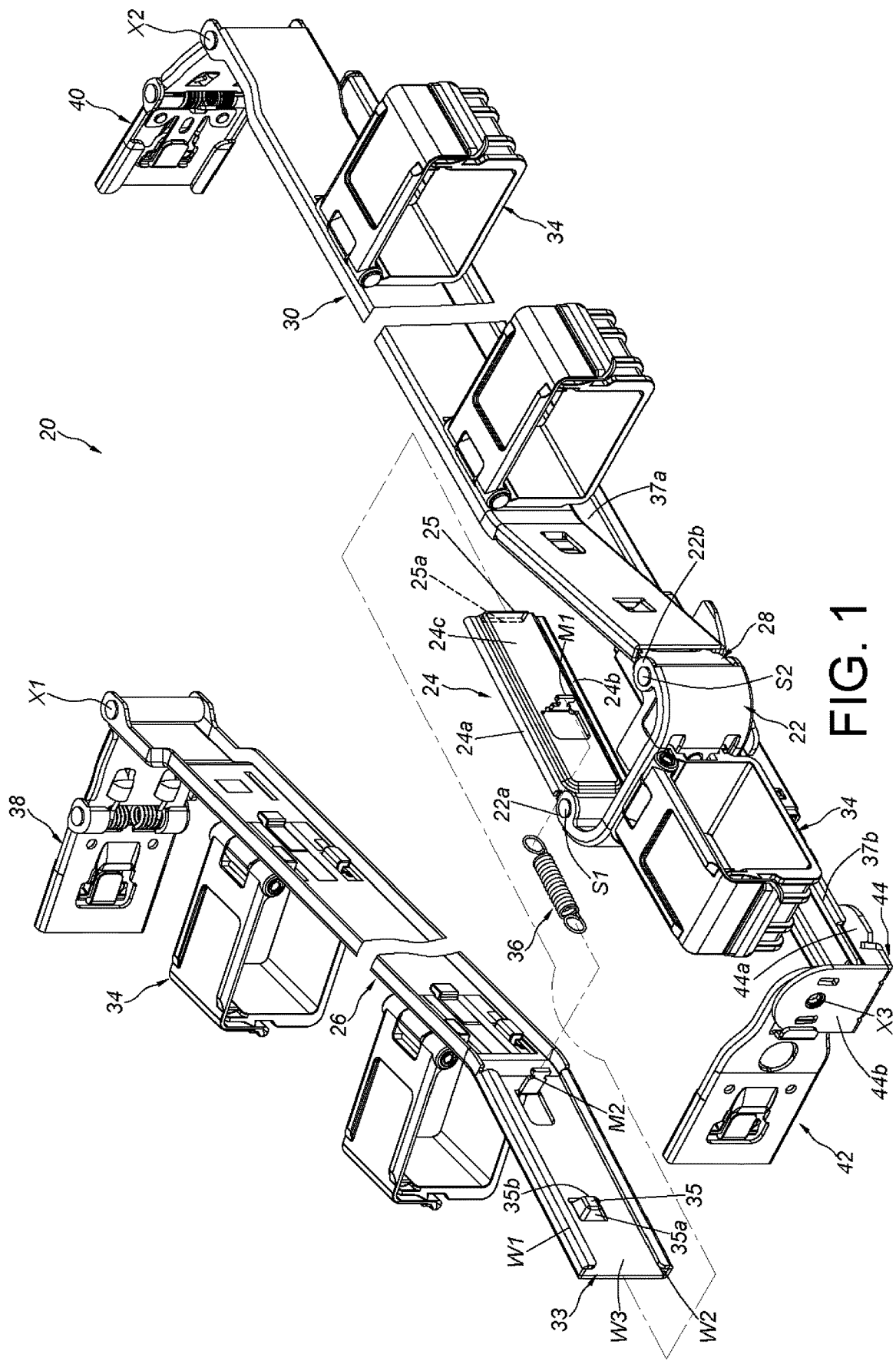
FIG. 1 is an exploded view of a cable management device according to an embodiment of the present invention.
Figure 2:
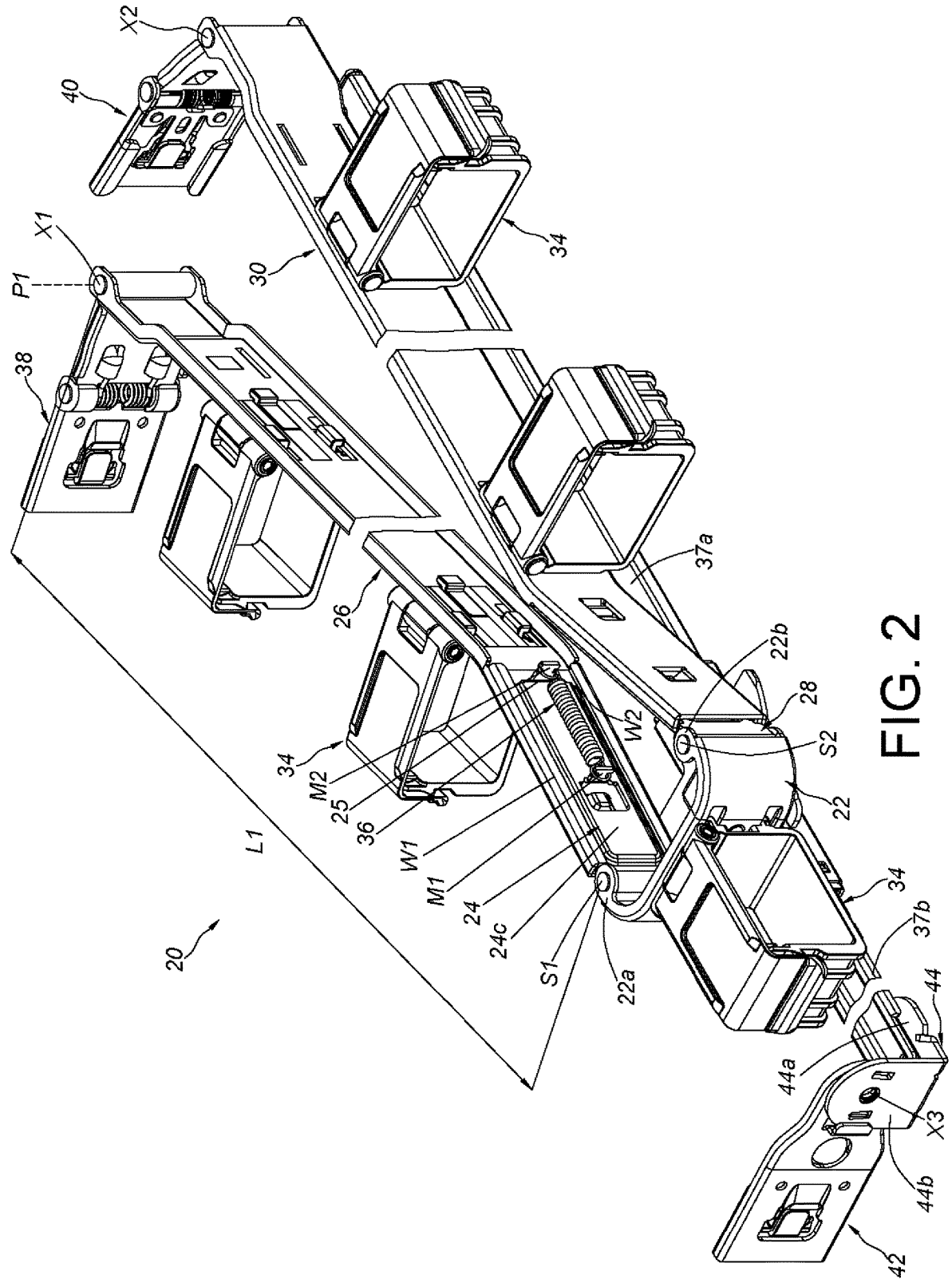
FIG. 2 is a diagram illustrating the cable management device in an angle of view according to the embodiment of the present invention.

As shown in FIG. 1 and FIG. 2, a cable management device 20 of an embodiment of the present invention includes a connecting member 22, a first component 24 and a first cable management arm 26. Preferably, the cable management device 20 further includes a second component 28 and a second cable management arm 30. Wherein, the first component 24 and the second component 28 have a substantially same structural arrangement, and the first cable management arm 26 and the second cable management arm 30 have a substantially same structural arrangement. In addition, the structural relationship between the first component 24 and the first cable management arm 26 is substantially the same as the structural relationship between the second component 28 and the second cable management arm 30, but the present invention is not limited thereto.

The first component 24 and the second component 28 are respectively connected to two different portions of the connecting member 22. Preferably, the first component 24 is pivoted to a first end portion 22a of the connecting member 22 through a first shaft S1 (for example, the first shaft S1 penetrates through the first component 24 and the first end portion 22a of the connecting member 22). The first cable management arm 26 is connected to the first component 24 in a stretchable and retractable manner. On the other hand, the second component 28 is pivoted to a second end portion 22b of the connecting member 22 through a second shaft S2 (for example, the second shaft S2 penetrates through the second component 28 and the second end portion 22b of the connecting member 22). The second cable management arm 30 is connected to the second component 28 in a stretchable and retractable manner. In other words, the second cable management arm 30 is connected to the connecting member 22 through the second component 28.

Wherein, at least one cable management feature is arranged on the first cable management arm 26, the second cable management arm 30 and/or the connecting member 22. Preferably, the first cable management arm 26, the second cable management arm 30 and the connecting member 22 respectively include a cable management feature 34, but it is not limited specifically. For example, the cable management features 34 can be arranged on the first cable management arm 26 and the second cable management arm 30, and the connecting member 22 has no cable management feature. Alternatively, the cable management feature 34 can be only arranged on one of the first cable management arm 26 and the second cable management arm 30, and the connecting member 22 and another one of the first cable management arm 26 and the second cable management arm 30 have no cable management feature.

Preferably, the cable management feature 34 is detachably mounted on the first cable management arm 26, the second cable management arm 30 and the connecting member 22. Alternatively, a predetermined cable management feature can be respectively formed on the first cable management arm 26, the second cable management arm 30 and the connecting member 22. The cable management device 20 is able to support or to accommodate cables of a carried object through the at least one cable management feature. Since the technical feature is obvious to a person having ordinary skill in the art, related description is omitted herein for simplicity.

Preferably, the first cable management arm 26 has a structural feature corresponding to another structural feature of the first component 24, such that the first cable management arm 26 is able to be moved linearly relative to the first component 24. For example, at least one arm section of the first cable management arm 26 includes a first wall W1, a second wall W2 and a third wall W3 connected between the first wall W1 and the second wall W2. The first wall W1 and the second wall W2 are bent relative to the third wall W3, and a guiding passage 33 is defined by the first wall W1, the second wall W2 and the third wall W3. In addition, the third wall W3 has a blocking portion 35 arranged in the guiding passage 33. The blocking portion 35 includes a guiding end 35a and a blocking end 35b opposite to the guiding end 35a, wherein the guiding end 35a is arranged toward an inserted end of the guiding passage 33. The guiding end 35a may be an inclined surface or an arc surface, and the blocking end 35b may be a perpendicular surface, but it is not limited thereto. On the other hand, at least one part of the first component 24 is located and accommodated in the guiding passage 33. Wherein, the first component 24 includes a first portion 24a, a second portion 24b and a third portion 24c connected between the first portion 24a and the second portion 24b. In addition, a corresponding feature 25a is formed on an end 25 of the third portion 24c, e.g., the corresponding feature 25a is a bending edge, but it is not limited thereto, and the corresponding feature 25a is corresponding to the blocking end 35b of the blocking portion 35. When assembling, through the end 25 of the first component 24 inserting into the inserted end of the guiding passage 33 of the first cable management arm 26, the corresponding feature 25a of the end 25 of the first component 24 abuts the guiding end 35a of the blocking portion 35 in advance and then passes over the guiding end 35a of the blocking portion 35. The first portion 24a and the first wall W1 are able to support each other, and the second portion 24b and the second wall W2 are able to support each other, and the third portion 24c and the third wall W3 are able to support each other. However, in another embodiment, the structural feature of the first cable management arm 26 and the structural feature the first component 24 can also be a combination of an elongate hole (slot) and a protruded structure penetrating a portion of the elongate hole (slot), such that the first cable management arm 26 is also able to be moved linearly relative to the first component 24. Wherein, an extending direction of the elongate hole (slot) is the same as a length direction of the first cable management arm 26 (or the first component 24). Therefore, the technical mean of displacement of the first cable management arm 26 relative to the first component 24 is not limited specifically.

Preferably, the cable management device 20 further includes a first elastic member 36 arranged between the first component 24 and the first cable management arm 26. The first elastic member 36 is configured to provide an elastic force to the first cable management arm 26. In the present embodiment, the first elastic member 36 is a resetting spring, and two ends of the first elastic member 36 are mounted on a first mounting portion M1 of the first component 24 and a second mounting portion M2 of the first cable management arm 26, but it is not limited specifically. According to the above arrangement, as shown in FIG. 2, the first elastic member 36 is able to provide an elastic force to the first cable management arm 26, such that the first component 24 can be moved back to an original position relative to the first cable management arm 26. When that the first component 24 is moved back to an original position relative to the first cable management arm 26, an end 25 of the first component 24 can be blocked by the second mounting portion M2 of the first cable management arm 26, such that the first cable management arm 26 can be kept in a first predetermined position P1 relative to the first component 24. In other words, through being applied to an elastic force provided by first elastic member 36 and being blocked by the second mounting portion M2, the first cable management arm 26 is able to be kept in the first predetermined position P1 relative to the first component 24. When the first cable management arm 26 is located at the first predetermined position P1 relative to the first component 24, the cable management device 20 has a first length L1.

Preferably, the cable management device 20 further includes at least one supporting member configured to support one of the first cable management arm 26 and the second cable management arm 30. In the present embodiment, the at least one supporting member includes a first supporting member 37a and a second supporting member 37b connected to the first supporting member 37a in a stretchable and retractable manner. The first supporting member 37a and the second supporting member 37b are configured to support one of a bottom of the first cable management arm 26 and a bottom of the second cable management arm 30.

Preferably, the cable management device 20 further includes a first mounting device 38, a second mounting device 40 and a third mounting device 42 are respectively arranged on the first cable management arm 26, the second cable management arm 30 and the at least one supporting member (such as the second supporting member 37b). Furthermore, the first mounting device 38 is pivoted to an end portion of the first cable management arm 26 through a first pivot member X1 (for example, the first pivot member X1 penetrates the first mounting device 38 and the end portion of the first cable management arm 26). The second mounting device 40 is pivot to an end portion of the second cable management arm 30 through a second pivot member X2 (for example, the second pivot member X2 penetrates the second mounting device 40 and the end portion of the second cable management arm 30). The third mounting device 42 is pivoted to a supporting base 44 of the at least one supporting member through a third pivot member X3 (for example, the third pivot member X3 penetrates the third mounting device 42 and the supporting base 44 of the at least one supporting member). Preferably, the supporting base 44 has a supporting portion 44a and a lateral portion 44b substantially perpendicularly connected to the supporting portion 44a. The supporting portion 44a is connected (such as pivoted) to the at least one supporting member. The third mounting device 42 is pivoted to the lateral portion 44b through a third pivot member X3.

Figure 3:
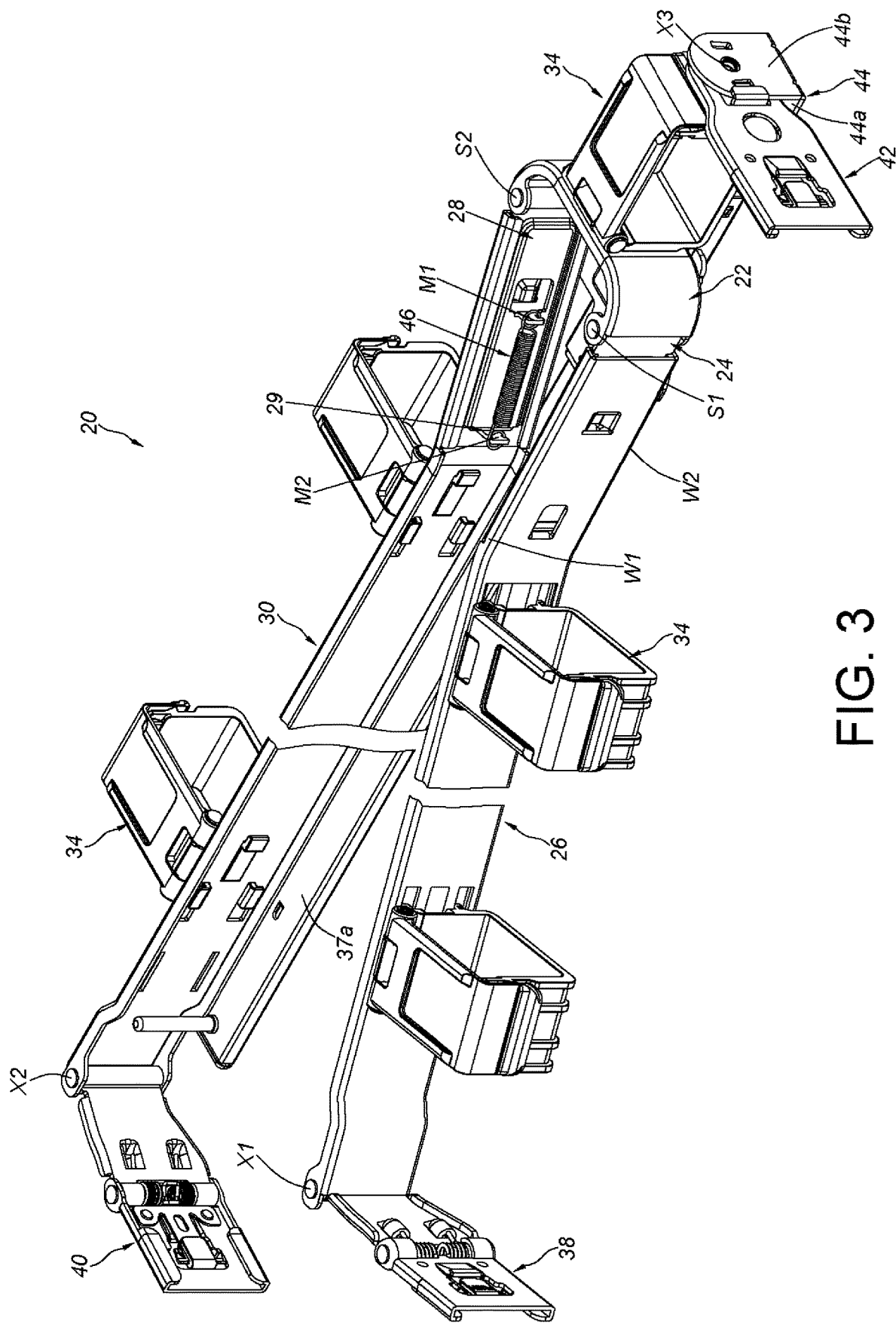
FIG. 3 is a diagram illustrating the cable management device in another angle of view according to the embodiment of the present invention.

As shown in FIG. 3, the cable management device 20 further includes a second elastic member 46 arranged between the second component 28 and the second cable management arm 30. The second elastic member 46 is configured to provide an elastic force to the second cable management arm 30. In the present embodiment, the second elastic member 46 is a resetting spring, and two ends of the second elastic member 46 are respectively mounted on a first mounting portion M1 of the second component 28 and a second mounting portion M2 of the second cable management arm 30, but the present invention is not limited thereto. As such, the second elastic member 46 is able to provide an elastic force to the second cable management arm 30, such that the second component 28 can be moved back to an original position relative to the second cable management arm 30. When the second component 28 is moved back to an original position relative to the second cable management arm 30, an end 29 of the second component 28 can be blocked by the second mounting portion M2 of the second cable management arm 30, such that the second cable management arm 30 can be kept in a first predetermined position P1 relative to the second component 28. In other words, through being applied to an elastic force provided by second elastic member 46 and being blocked by the second mounting portion M2 of the second cable management arm 30, the second cable management arm 30 is able to be kept in the first predetermined position P1 relative to the second component 28.

Figure 4:
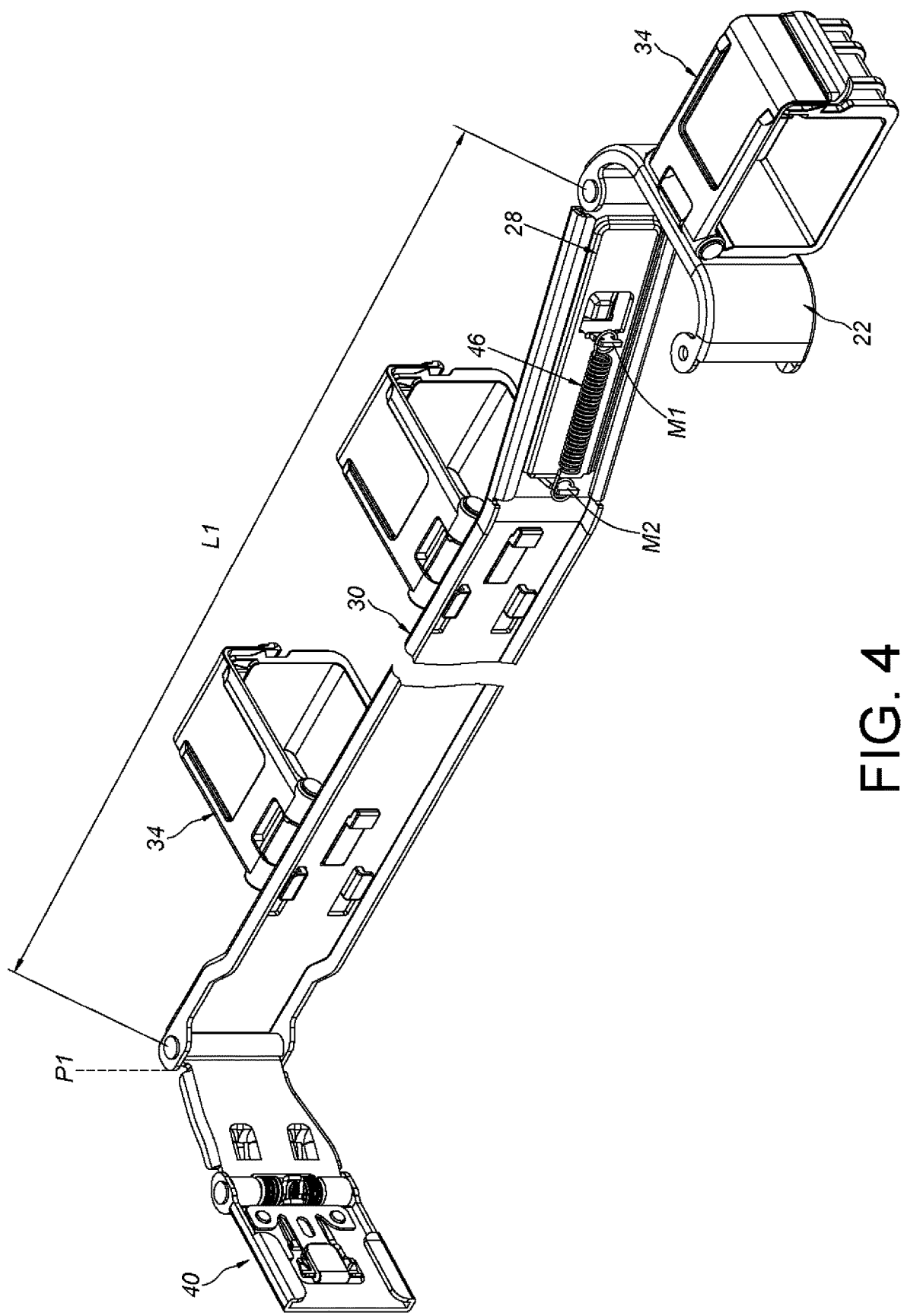
FIG. 4 is a diagram illustrating the cable management device having a first length according to the embodiment of the present invention.

As shown in FIG. 4, the second cable management arm 30 is able to located at the first predetermined position P1 relative to the second component 28, such that the cable management device 20 has the first length L1. Preferably, by the second elastic member 46 providing an elastic force, the second cable management arm 30 is able to be kept in the first predetermined position P1 relative to the second component 28. It is noticed that the first cable management arm 26 and the first component 24 are not shown in FIG. 4.

Figure 5:
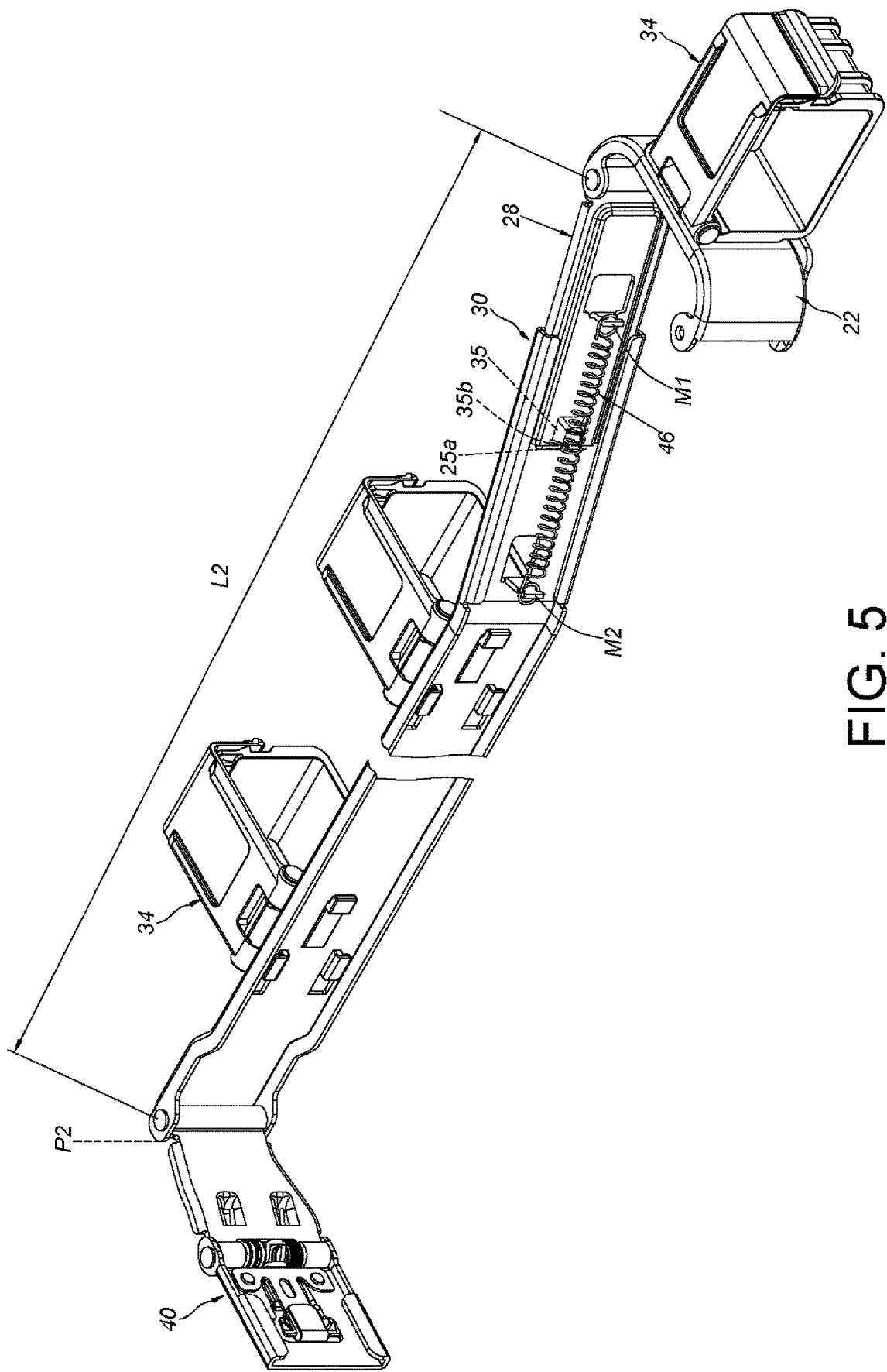
FIG. 5 is a diagram illustrating the cable management device having a second length according to the embodiment of the present invention.

As shown in FIG. 5, one of the cable management arms of the cable management device 20 (the first cable management arm 26 or the second cable management arm 30) is able to be located on a second predetermined position P2 relative to the component (the first component 24 or the second component 28). In the present embodiment, the second cable management arm 30 is able to be located on the second predetermined position P2 relative to the second component 28, such that the cable management device 20 has a second length L2 greater than the first length L1. Wherein, the second elastic member 46 accumulates the elastic force. It is noticed that, the first cable management arm 26 and the first component 24 are not shown in FIG. 5.

Figure 6:
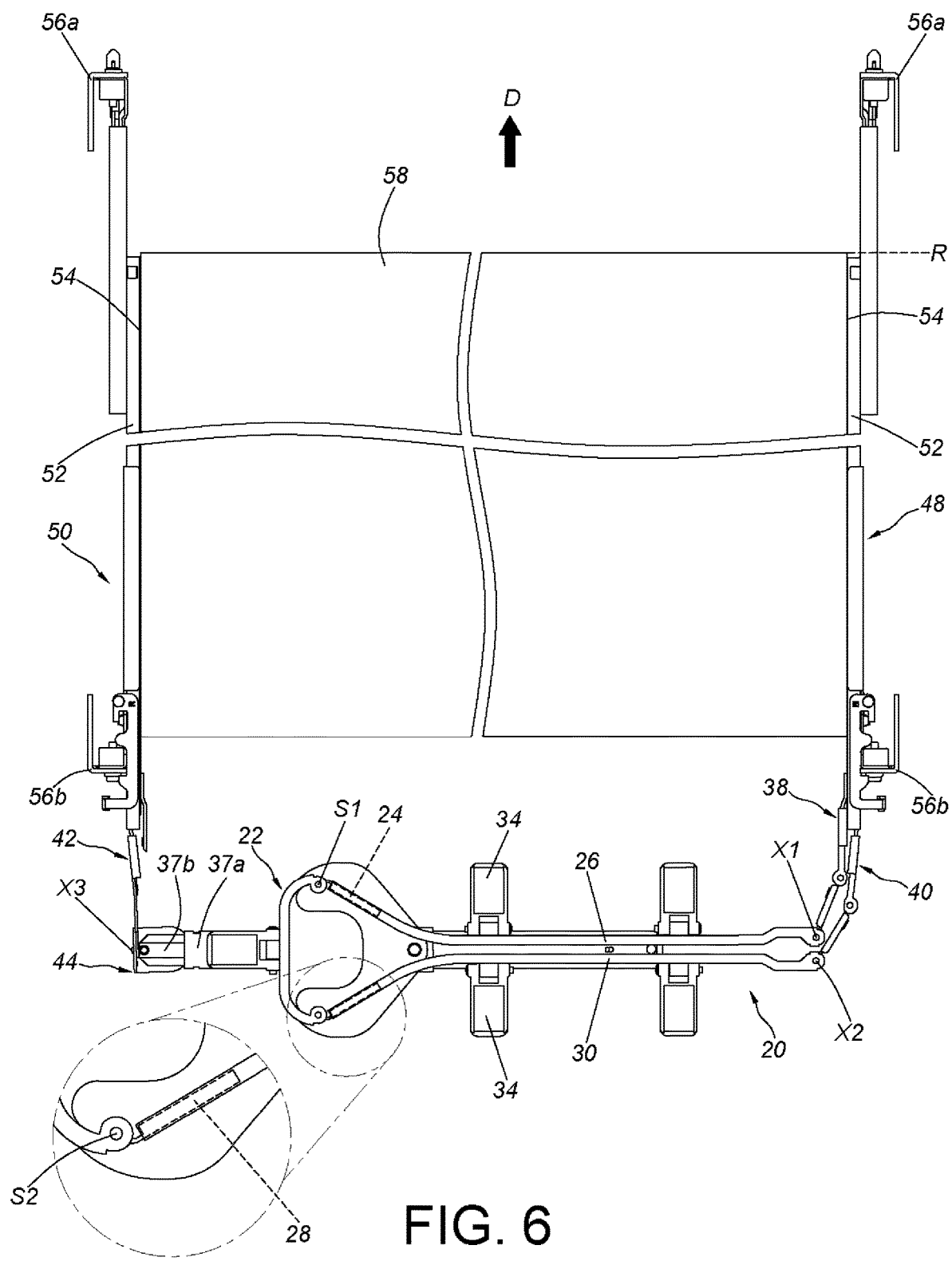
FIG. 6 is a diagram illustrating the cable management device applied to a rack and two cable management arms of the cable management device are close to each other according to the embodiment of the present invention.

As shown in FIG. 6, a connecting assembly according to the embodiment of the present invention includes a first slide rail assembly 48 and the cable management device 20. Preferably, the connecting assembly further includes a second slide rail assembly 50. The first slide rail assembly 48 and the second slide rail assembly 50 respectively includes a first rail 52 and a second rail 54, and the first rail 52 and the second rail 54 are movable relative each other. In the present embodiment, the first rail 52 is able to be mounted on a first post 56a and a second post 56b of a rack, and the second rail 54 carries a carried object 58 (such as an electronic apparatus), such that the carried object 58 is movable relative to the first rail 52 through the second rail 54. Wherein, the second rail 54 is located at a retracted position R relative to the first rail 52.

FIG. 6 is a diagram illustrating the first cable management arm 26 is able to be mounted (such as detachably mounted) on the second rail 54 of the first slide rail assembly 48 through the first mounting device 38. The second cable management arm 30 is able to be mounted (such as detachably mounted) on the first rail 52 of the first slide rail assembly 48 through the second mounting device 40. The at least one supporting member (the first supporting member 37*a* and the second supporting member 37*b*) is able to be mounted (such as detachably mounted) on the first rail 52 of the second slide rail assembly 50 through the third mounting device 42. When the second rail 54 is located at the retracted position R relative to the first rail 52, the first cable management arm 26 and the second cable management arm 30 are close to each other. Wherein, the first supporting member 37*a* and the second supporting member 37*b* are configured to support one of a bottom of the first cable management arm 26 and a bottom of the second cable management arm 30. It is noticed that the first elastic member 36 and the second elastic member 46 are omitted in FIG. 6 to FIG. 8.

Figure 7:
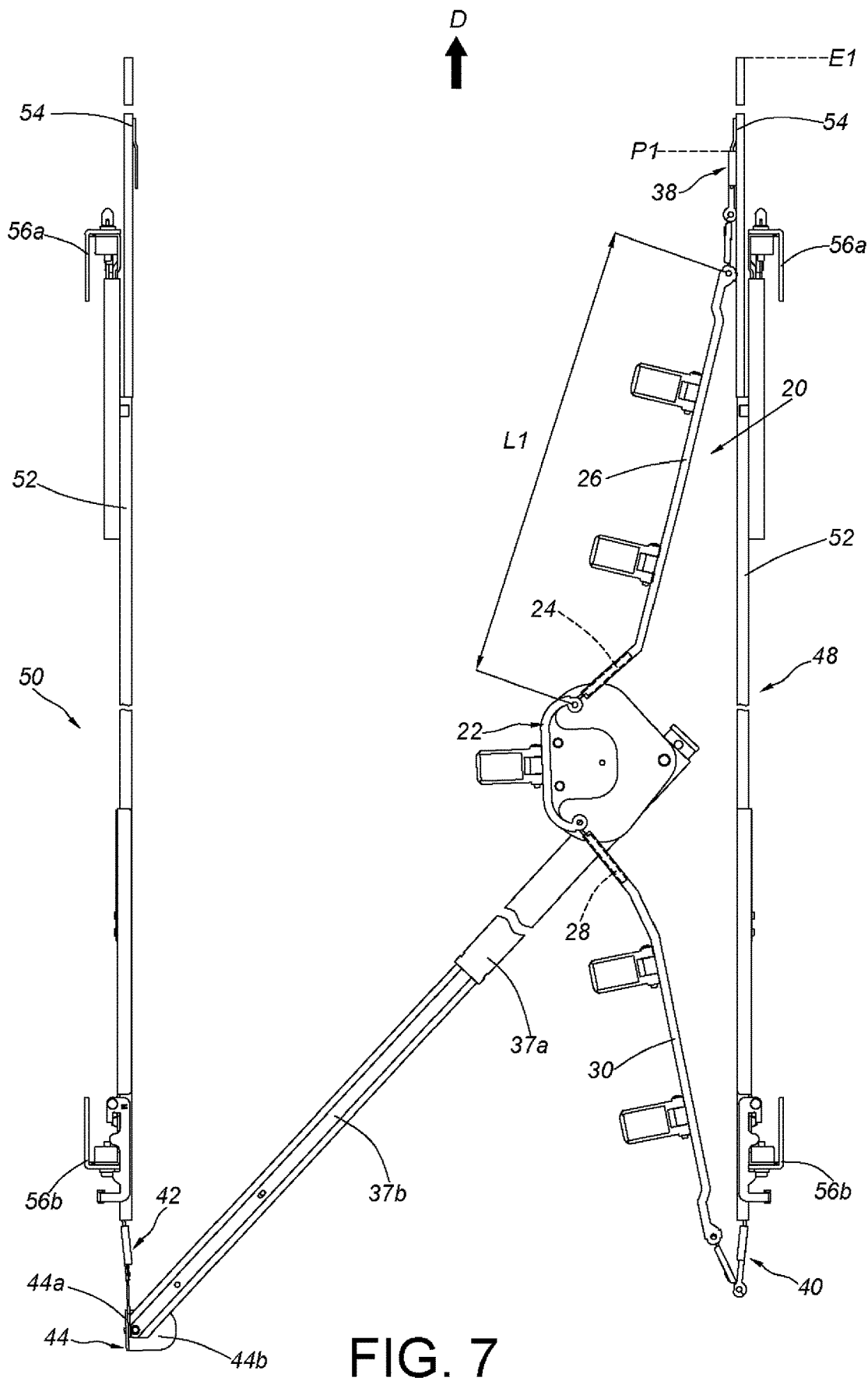
FIG. 7 is a diagram illustrating the cable management device applied to the rack and two cable management arms of the cable management device are unfolded relative to each other with the first length according to the embodiment of the present invention.

As shown in FIG. 7, the first cable management arm 26 is located at the first predetermined position P1 relative to the first component 24, such that the cable management device 20 has the first length L1. Wherein, the second rail 54 is able to be moved from the retracted position R to a first extension position E1 along an open direction D relative to the first rail 52, such that the first cable management arm 26 and the second cable management arm 30 are unfolded relative to each other.

Figure 8:
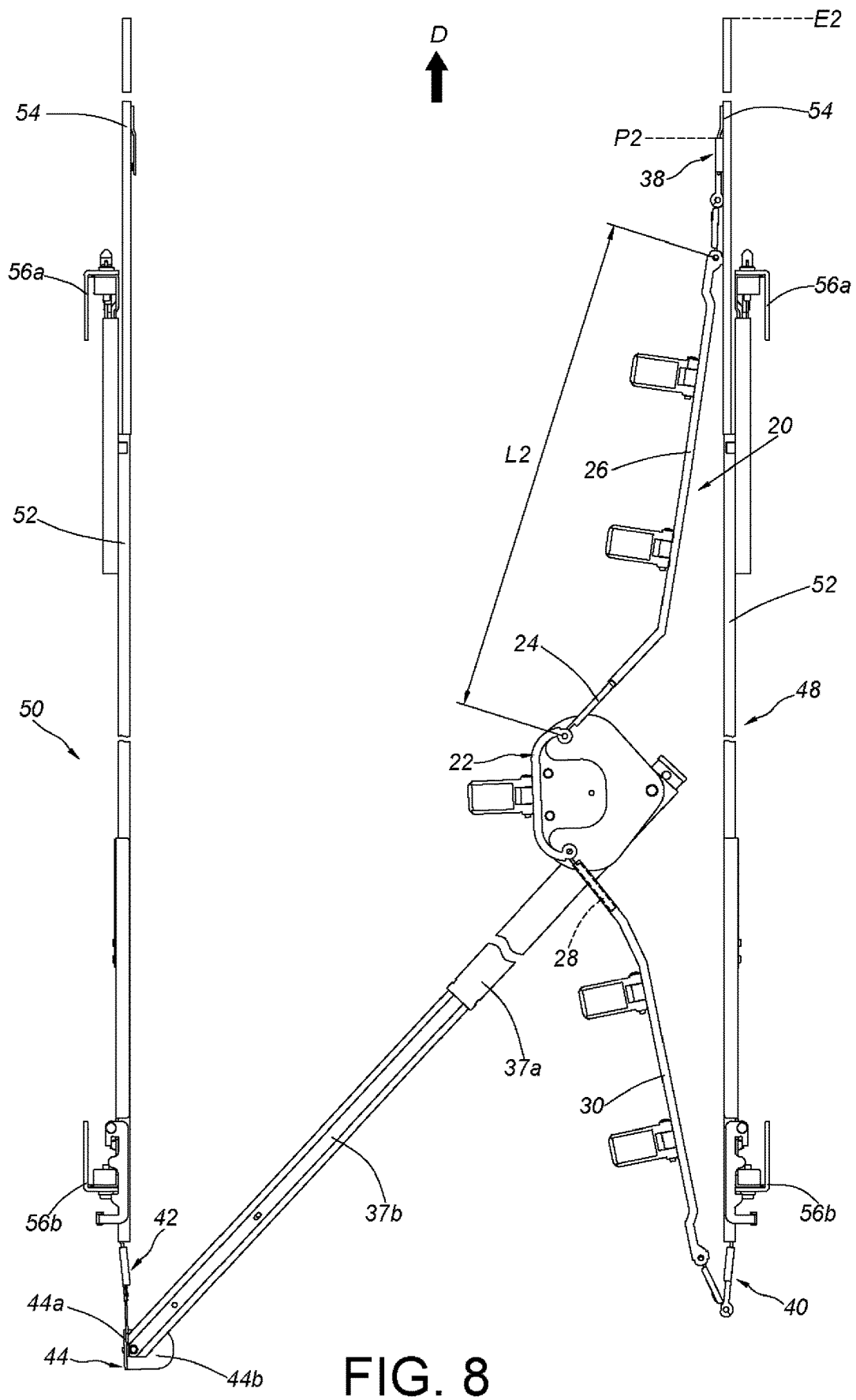
FIG. 8 is a diagram illustrating the cable management device applied to the rack and two cable management arms of the cable management device are unfolded relative to each other with the second length according to the embodiment of the present invention.

As shown in FIG. 8, when the second rail 54 is further moved to a second extension position E2 along the open direction D relative the first rail 52, the second rail 54 is able to drive the first cable management arm 26 to move to the second predetermined position P2 relative to the first component 24, such that the cable management device 20 has the second length L2 greater than the first length L1. According to the above arrangement, the cable management device 20 is adaptable to different slide rail assemblies having different extension length. In other words, when the second rail 54 is moved to the first extension position E1 relative to the first rail 52, the first elastic member 36 is not stretched by the second rail 54 located at the first extension position E1. That is to say the first elastic member 36 is able to keep the first cable management arm 26 in the first predetermined position P1 relative to the first component 24 (please also refer to FIG. 2). When the second rail 54 is moved to the second extension position E2 relative to the first rail 52, the first elastic member 36 is stretched by the second rail 54 located at the second extension position E2, such that the first cable management arm 26 is able to be kept in the second predetermined position P2 relative to the first component 24 through the blocking end 35*b* of the blocking portion 35 of the first cable management arm 26 abutting the corresponding feature 25*a* of the end 25 of the first component 24 (please refer to FIG. 5).

It is noticed that in another embodiment, through the first mounting device 38, the second mounting device 40 and the third mounting device 42 being rotatable, the second cable management arm 30 is able to be mounted on the second rail 54 of the second slide rail assembly 50 by the second mounting device 40, and the first cable management arm 26 is able to be mounted on the first rail 52 of the second slide rail assembly 50 by the first mounting device 38, and the at least one supporting member is able to be mounted on the first rail 52 of the first slide rail assembly 48 by the third mounting device 42. In other words, the cable management device 20 is able to be applied to the first slide rail assembly 48 on a left side of the rack, or applied to the second slide rail assembly 50 on a right side of the rack. Therefore, the cable management device 20 is interchangeable between the left and right sides of the rack.

Compared to the prior art, the connecting assembly and the cable management device of the present invention have advantages over the prior art by the following perspectives:

1. The first component 24 is connected to the connecting member 22. The first cable management arm 26 is connected to the first component 24 in a stretchable and retractable manner. Through the first cable management arm 26 (or the second cable management arm 30) being located at different predetermined positions, the cable management device 20 can have different length. According to the arrangement, the cable management device 20 can be applied to different slide rail assemblies having different extension length.

2. The first elastic member 36 is configured to provide an elastic force to the first cable management arm 26, such that the first cable management arm 26 is able to be kept in the first predetermined position P1 relative to the first component 24.

3. The first cable management arm 26 is able to be mounted on the first rail 52 of the first slide rail assembly 48 through the first mounting device 38, and the second cable management arm 30 is able to be mounted on the second rail 54 of the first slide rail assembly 48 through the second mounting device 40.

4. The cable management device 20 is able to be applied to the first slide rail assembly 48 on a left side of the rack or applied to the second slide rail assembly 50 on a right side of the rack. Therefore, the cable management device 20 is interchangeable between the left and right sides of the rack.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cable management device, comprising:
   a connecting member;
   a first component connected to a portion of the connecting member, the portion of the connecting member being configured to support the first component; and
   a first cable management arm connected to the first component in a stretchable and retractable manner;
   wherein at least one cable management feature is arranged on the first cable management arm;
   wherein, when the first cable management arm is located at a first predetermined position relative to the first component, the cable management device has a first length and the portion of the connecting member supports the first component;
   wherein, when the first cable management arm is located at a second predetermined position relative to the first component, the cable management device has a second length greater than the first length and the portion of the connecting member supports the first component.

2. The cable management device of claim 1, wherein the first component is pivoted to the portion of the connecting member.

3. The cable management device of claim 2, further comprising:

a second component pivoted to another portion the connecting member; and
a second cable management arm connected to the second component in a stretchable and retractable manner;
wherein the another portion of the connecting member is configured to support the second component.

4. The cable management device of claim 3, wherein the first component is pivoted to the portion of the connecting member through a first shaft, the second component is pivoted to the another portion of the connecting member different from the portion of the connecting member through a second shaft.

5. The cable management device of claim 1, further comprising a first elastic member arranged between the first component and the first cable management arm.

6. The cable management device of claim 3, further comprising:
a first elastic member arranged between the first component and the first cable management arm;
Wherein the first elastic member is substantially undeformed when the first cable management arm is located at the first predetermined position relative to the first component;
wherein the first elastic member is deformed when the first cable management arm is located at the second predetermined position relative to the first component.

7. The cable management device of claim 6, further comprising:
a second elastic member arranged between the second component and the second cable management arm.

8. The cable management device of claim 1, wherein the first cable management arm has a structural feature corresponding to another structural feature of the first component, such that the first cable management arm is able to be moved linearly relative to the first component.

9. The cable management device of claim 3, further comprising:
at least one supporting member configured to support one of the first cable management arm and the second cable management arm;
wherein the at least one supporting member comprises a first supporting member and a second supporting member connected to the first supporting member in a stretchable and retractable manner, the first supporting member and the second supporting member are configured to support one of a bottom of the first cable management arm and a bottom of the second cable management arm.

10. A connecting assembly, comprising:
a first slide rail assembly comprising a first rail and a second rail, wherein the first rail and the second rail are movable relative to each other; and
a cable management device comprising:
a connecting member;
a first component connected to a portion of the connecting member, the portion of the connecting member being configured to support the first component;
a first cable management arm movable relative to the first component, wherein the first cable management arm is able to be mounted to the second rail of the first slide rail assembly through a first mounting device; and
a second cable management arm connected to the connecting member, wherein the second cable management arm is able to be mounted to the first rail of the first slide rail assembly through a second mounting device;

wherein, when the first cable management arm is located at a first predetermined position relative to the first component, the cable management device has a first length and the portion of the connecting member supports the first component;
wherein, when the first cable management arm is located at a second predetermined position relative to the first component, the cable management device has a second length greater than the first length and the portion of the connecting member supports the first component.

11. The connecting assembly of claim 10, wherein the first component is pivoted to the portion of connecting member, the first cable management arm is connected to the first component in a stretchable and retractable manner.

12. The connecting assembly of claim 11, wherein the second cable management arm is connected to the connecting member through a second component, another portion of the connecting member is configured to support the second component.

13. The connecting assembly of claim 12, wherein the second component is pivoted to the another portion of the connecting member, the second cable management arm is connected to the second component in a stretchable and retractable manner, at least one cable management feature is arranged on one of the first cable management arm and the second cable management arm.

14. The connecting assembly of claim 13, wherein the first component is pivoted to the portion of the connecting member through a first shaft, the second component is pivoted to the another portion of the connecting member different from the portion of the connecting member through a second shaft.

15. The connecting assembly of claim 10, further comprising a first elastic member arranged between the first component and the first cable management arm, the first elastic member configured to provide an elastic force to the first cable management arm.

16. The connecting assembly of claim 13, further comprising:
a first elastic member arranged between the first component and the first cable management arm;
wherein the first elastic member is substantially undeformed when the first cable management arm is located at the first predetermined position relative to the first component;
wherein the first elastic member is deformed when the first cable management arm is located at the second predetermined position relative to the first component.

17. The connecting assembly of claim 16, further comprising:
a second elastic member arranged between the second component and the second cable management arm;
a second slide rail assembly; and
at least one supporting member configured to support one of the first cable management arm and the second cable management arm;
wherein the second slide rail assembly comprises a first rail and a second rail, the first rail and the second rail of the second slide rail assembly are movable relative to each other, the at least one supporting member is able to be mounted on the first rail of the second slide rail assembly through a third mounting device, the at least one supporting member is configured to support one of the first cable management arm and the second cable management arm.

18. The connecting assembly of claim 17, wherein the first mounting device is pivoted to the first cable management arm, the second mounting device is pivoted to the second cable management arm, the third mounting device is pivoted to the at least one supporting member.

19. A cable management device, comprising:
   a connecting member;
   a first component connected to a portion of the connecting member, the portion of the connecting member being configured to support the first component; and
   a first cable management arm movable relative to the first component, wherein at least one cable management feature is arranged on the first cable management arm;
   wherein, when the first cable management arm is located at a first predetermined position relative to the first component, the cable management device has a first length and the portion of the connecting member supports the first component;
   wherein, when the first cable management arm is located at a second predetermined position relative to the first component, the cable management device has a second length greater than the first length and the portion of the connecting member supports the first component.

20. The cable management device of claim 19, wherein the first component is pivoted to the portion of the connecting member, the first cable management arm is connected to the first component in a stretchable and retractable manner, the cable management device further comprises a second component and a second cable management arm, the second component is pivoted to another portion of the connecting member, the second cable management arm is connected to the second component in a stretchable and retractable manner, the another portion of the connecting member is configured to support the second component, the cable management device further comprising a first elastic member and a second elastic member, the first elastic member is arranged between the first component and the first cable management arm, the first elastic member is configured to provide an elastic force to the first cable management arm, the second elastic member is arranged between the second component and the second cable management arm, the second elastic member is configured to provide an elastic force to the second cable management arm;
   wherein the first elastic member is substantially undeformed when the first cable management arm is located at the first predetermined position relative to the first component;
   wherein the first elastic member is deformed when the first cable management arm is located at the second predetermined position relative to the first component.

21. The cable management device of claim 3, wherein when the first cable management arm and the second cable management arm are unfolded to a predetermined angle relative to each other, the first cable management arm is able to be moved to a second predetermined position relative to the first component.

22. The connecting assembly of claim 12, wherein when the first cable management arm and the second cable management arm are unfolded to a predetermined angle relative to each other, the first cable management arm is able to be moved to a second predetermined position relative to the first component.

23. The cable management device of claim 20, wherein when the first cable management arm and the second cable management arm are unfolded to a predetermined angle relative to each other, the first cable management arm is able to be moved to a second predetermined position relative to the first component.

* * * * *